United States Patent [19]
Lee et al.

[11] Patent Number: 5,535,231
[45] Date of Patent: Jul. 9, 1996

[54] OPTOELECTRONIC CIRCUIT INCLUDING HETEROJUNCTION BIPOLAR TRANSISTOR LASER AND PHOTODETECTOR

[75] Inventors: KwyRo Lee, Taejon, Rep. of Korea; Michael Shur, Charlottesville; Stephen H. Jones, Afton, both of Va.

[73] Assignee: Samsung Electronics Co., Ltd., Seoul, Rep. of Korea

[21] Appl. No.: 336,027

[22] Filed: Nov. 8, 1994

[51] Int. Cl.$^6$ ........................................................ H01S 3/19
[52] U.S. Cl. ................................. 372/50; 257/82; 257/83; 257/84
[58] Field of Search .......................... 372/50, 45; 257/82, 257/83, 84

[56] References Cited

U.S. PATENT DOCUMENTS 5,301,202  4/1994  Harder et al. ............................ 372/46

FOREIGN PATENT DOCUMENTS 2-125467  5/1990  Japan ......................................... 257/83
6-132511  5/1994  Japan ......................................... 257/83
6-151812  5/1994  Japan ......................................... 257/83

OTHER PUBLICATIONS

Eugene Hecht, Optics, Chapter 14, Sundry Topics from Contemporary Optics, ©1987, pp. 578–593 (no month available).

Ken Werner, Higher Visibility of LEDs, IEEE Spectrum, Jul. 1994, pp. 30–34.

C. Harder, P. Buchmann, and H. Meier, High–Power Ridge–Waveguide AlGaAs Grin–Sch Laser Diode, Electronics Letters, 25th Sep. 1986, vol. 22, No. 20.

Gen–Lin Tan, J. M. Xu, and Michael Shur, GaAs/AlGaAs Double–Heterojunction Lateral p–i–n Ridge Waveguide Laser, Optical Engineering, Sep. 1993, vol. 32, No. 9, pp. 2042–2045.

Y. J. Yang, Y. C. Lo, G. S. Lee, K. Y. Hsieh, and R. M. Kolbas, Traverse Junction Stripe Laser With A Lateral Heterobarrier By Diffusion Enhanced Alloy Disordering, Aug. 4, 1986, pp. 835–837.

H. Namizaki, H. Kan, M. Ishii, and A. Ito, Transverse–Junction–Stripe–Geometry Double–Heterostructure Lasers With Very Low Threshold Current, Feb. 20, 1974, pp. 2785–2786.

Gen–Lin Tan, Naveen Bewtra, Keith Lee, and J. M. Xu, A Two–Dimensional Nonisothermal Finite Element Simulation of Laser Diodes; IEEE Journal of Quantum Electronics, vol. 29, No. 3, Mar., 1993, pp. 822–835.

Yongkun Sin, K. Y. Hsieh, J. H. Lee, and R. M. Kolbas, Surface And Bulk Leakage Currents In Transverse Junction Stripe Lasers, J. Appl. Phys. 69 (2), Jan. 15, 1991, pp. 1081–1090.

T. Ohtoshi, K. Yamaguchi, C. Nagaoka, T. Uda, Y. Murayama, and N. Chinone, A Two–Dimensional Device Simulator Of Semiconductor Lasers, Solid–State Electronics, vol. 30, No. 6, ©1987, pp. 627–638 (no month).

Masahiro Asada, Atsushi Kamey Ama and Yasuharu Suematsu, Gain And Intervalence Band Absorption In Quantum–Well Lasers, IEEE Journal of Quantum Electronics, vol. QE–20, No. 7, Jul. 7, 1984, pp. 745–753.

(List continued on next page.)

*Primary Examiner*—Rodney B. Bovernick
*Assistant Examiner*—Yisun Song
*Attorney, Agent, or Firm*—Skjerven, Morrill, MacPherson, Franklin & Friel

[57] ABSTRACT

An optoelectronic integrated circuit furnishes a monolithic integration of high-speed transistors, lasers and photodetectors for optoelectronic communication applications. The monolithic device integrates an indium phosphorus (InP)/indium gallium arsenide (InGaAs) emitter-down heterojunction bipolar transistor with an InP/InGaAs quantum well laser and modulator, and a metal-semiconductor-metal photodetector.

49 Claims, 4 Drawing Sheets

OTHER PUBLICATIONS

Akira Furuya, Masao Makiuchi, Osamu Wada, Toshio Fujii and Hiroyuki Nobuhara, AlGaAs/GaAs Lateral Current Injection (LCI)-MQW Laser Using Impurity-Induced Disordering, Japanese Journal of Applied Physics, vol. 20, No. 2, Feb. 1987, pp. L134–L135.

O. Wada, A. Furuya, and M. Makiuchi, Planar, Compitable OEIC's Based On Multiquantum Well Structures; IEEE Photonics Technology Letters, vol. 1, No. 1, Jan. 1989, pp. 16–18.

T. R. Chen, Katsuyuki Utaka, Yuhua Zhuang, Ya-Yun Liu, Amnon Yariv, A Vertical Monolithic Combination Of An InGaAsP/InP Laser And A Heterojunction Bipolar Transistor, IEEE Journal of Quantum Electronics, vol. QE–23, No. 6, Jun. 1987, pp. 919–924.

OPTOELECTRONIC CIRCUIT INCLUDING HETEROJUNCTION BIPOLAR TRANSISTOR LASER AND PHOTODETECTOR

This invention was made with United States Government support under Grant N00014-90-J-4006 awarded by the Department of the Navy. The United States Government has certain rights in the invention.

BACKGROUND OF THE INVENTION

1. Field of the Invention

This invention relates to optical-electronic integrated circuits, and more specifically to a monolithic integration of an optical-electronic integrated circuit including a laser, a photodetector and a heterojunction bipolar transistor and to a process for fabricating such a monolithic integrated circuit.

2. Description of Related Art

Light-emitting diodes, semiconductor injection lasers, photodetectors and photodiodes are devices which are assembled to create an optical-electrical communication system. The usefulness of such a system is largely determined by its operating speed. Within an optical-electrical communication system, optical signals are detected and converted to electrical signals, the electrical signals are conveyed to a light emitting diode or laser, generating optical signals which are communicated to optical signal detectors. One factor in realizing a high operating speed is a reduction in the time expended communicating signals between optical signal detectors and optical signal generators.

Device parasitics are a major limitation to the ultimate operating speeds of lasers and photodetectors. Thus, another factor in realizing a high operating speed is a capability to reduce device parasitics and the junction capacitances and internal resistances that cause large parasitics.

SUMMARY OF THE INVENTION

In accordance with the present invention, an optoelectronic integrated circuit furnishes a monolithic integration of high-speed transistors, lasers and photodetectors for optoelectronic communication applications. The monolithic device integrates an indium phosphorus (InP)/indium gallium arsenide (InGaAs) emitter-down heterojunction bipolar transistor with an InP/InGaAs quantum well laser and modulator, and a metal-semiconductor-metal photodetector.

The optoelectronic integrated circuit of the present invention has many advantages in comparison to other integration schemes. One advantage is the combination of a high-speed photodetector, a high-speed and high-gain heterostructure bipolar transistor and a high-speed quantum well laser in a single integrated circuit, thereby furnishing all necessary component devices for an optical repeater, optical-electrical interconnect device or optoelectronic logic gate in a single high-speed integrated circuit.

A further advantage of the present invention is achieved by utilizing diode contacts throughout the circuit to furnish appropriate load impedances. Thus, load impedances are supplied without incorporating large resistors which greatly increase the size of the integrated circuit.

The present invention supplies still further advantages by sharing the use of the metal layers among the photodetector, the transistor and the laser. This economical and simple design allows reduction in the size of the circuit while improving the speed and performance of the circuit.

Other advantages include a low collector-base capacitance, low base resistance, low ground inductance and smaller parasitics, all resulting in high-speed operational capability. A still additional advantage includes a high translucence of the semiconductor wafer which allows backside illumination of the circuit.

In accordance with an additional embodiment of the present invention, a method of fabricating the optoelectronic integrated circuit furnishes a simple process involving metal-organic chemical vapor deposition of multiple layers to construct semiconductor layers of the heterojunction bipolar transistor, the quantum well laser and the metal-semiconductor-metal photodetector simultaneously. The layers are etched to define a laser mesa structure and metal layers are formed and etched to furnish diodes and transistor and bias interconnects. The simple fabrication process leads to a high device yield and an ease of integration with high-speed heterojunction bipolar transistor technology.

BRIEF DESCRIPTION OF THE DRAWINGS

Reference numerals referring to the same feature are repeated in multiple figures.

DETAILED DESCRIPTION OF THE PREFERRED EMBODIMENTS

Figure 1:
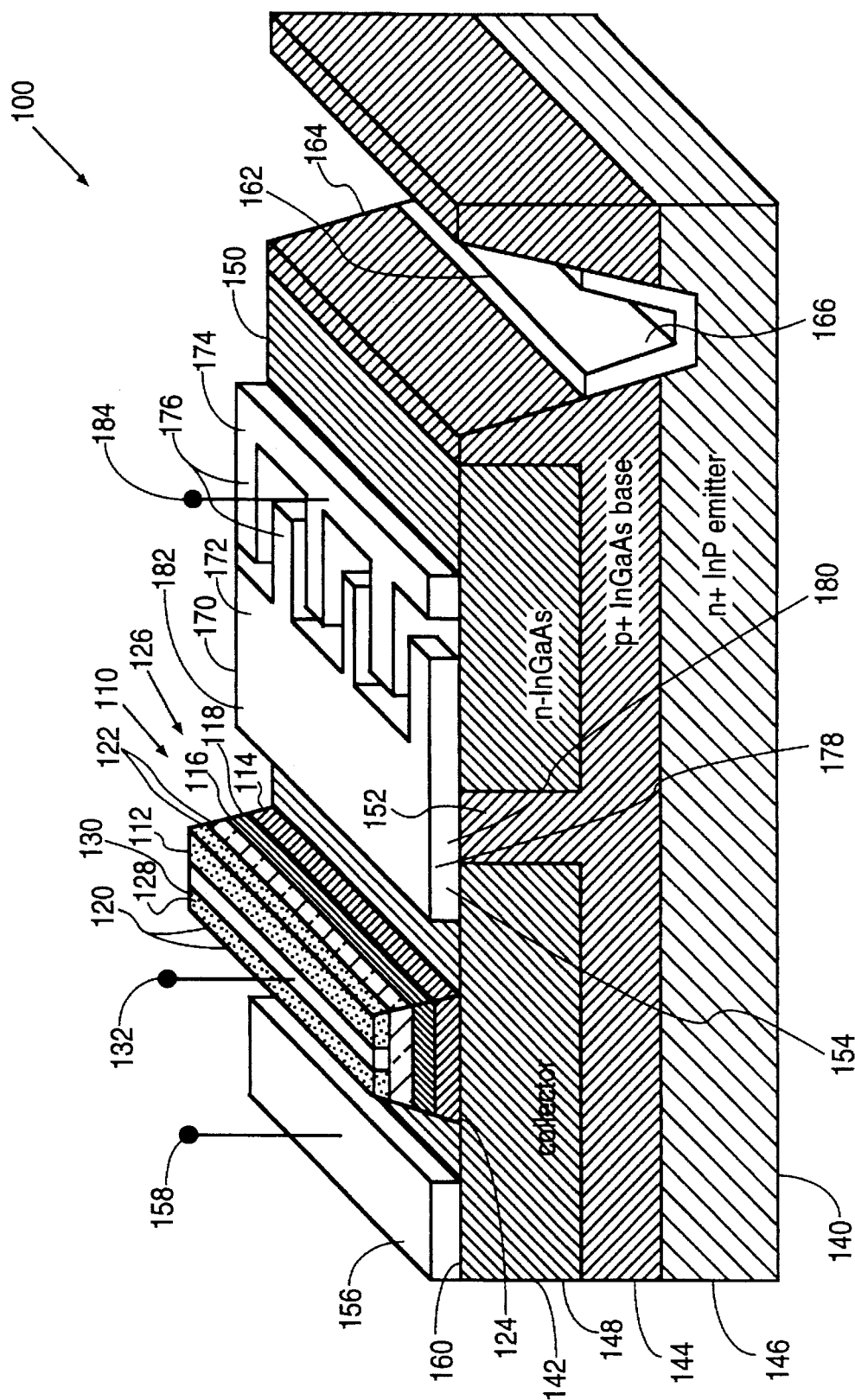
FIG. 1 is a pictorial cross-sectional view of an optoelectronic integrated circuit.

Referring to FIG. 1, a pictorial view of an embodiment of an InP-based OptoElectronic Integrated Circuit (OEIC) 100 is shown which includes a quantum laser 110, a heterojunction bipolar transistor (HBT) 140 and a metal-semiconductor-metal (MSM) photodetector 170. The overall dimension is approximately estimated 300×50μ. The OEIC 100 furnishes a current gain of approximately 200–500.

The OEIC 100 is configurable to various optical-electronic devices such as, for example, an optical repeater for optical fiber communication systems, an interconnect device furnishing optical interconnections for digital compound semiconductor integrated circuits in optical-electronic supercomputers or an optoelectronic logic gate.

The quantum laser 110, a InP/InGaAs/InP multiple quantum well heterostructure laser 110, is formed by a 300μ-cleaved cavity multiple quantum well InP/InGaAs heterostructure that is essentially a p-n junction 118 layer having a p-type upper layer 112 and an n-type lower layer 114 which are separated by an active region 116. A heterostructure semiconductor laser utilizes a different material on a side of the active region 116. Usually the different materials that are used to obtain a heterostructure have different bandgap and index of refraction than that of the active region 116. The laser 110 has a double heterostructure configuration in which the active region 116 layer—a thin layer of narrow energy gap material—is enclosed between the p-type 112 and n-type 114 layers of wide gap semiconductor material. The p-type upper layer 112 is an upper cladding in the form of a 1.5μ zinc-doped p$^+$ InP layer. A thin strip trench 128 is etched into the p-type upper layer 112 and a laser metallization strip 130 is deposited in the thin strip trench 128 to form a contact for a laser bias terminal 132. The n-type lower layer 114 is a lower cladding which is a 1.5μ silicon-doped n⁺ InP layer. The active region 116 is a flat and uniform p-n junction 118 bounded on facing sides by the two parallel InP layer mirrors 112 and 114 perpendicular to the plane of the junction 118. The active region 116 includes four to sixteen, 7 nm thick $In_{0.53}Ga_{0.47}As$ layers 120 sandwiched between 15 nm thick InP barrier layers 122. A contact between the HBT 140 collector and the lower cladding is a 7μ $SiO_2$ insulated Al/Au strip 124. The operating wavelength of the laser 110 is controlled by varying the thickness of the InGaAs layers 120. The quantum laser 110 forms a laser mesa structure 126 overlying a portion of the OEIC 100.

A forward bias voltage is applied to activate the laser 110 so that electrons are injected from the n-type material 114 into the p-type layer 112 and holes are injected into the n-type layer 114 to form an excess electron-hole concentration. The injected electron-hole pairs recombine in the active region by radiative and non-radiative processes. A sufficiently large electron-hole pair concentration causes the number of stimulated photons to exceed the number of absorbed photons. Under this condition, optical gain occurs by positive feedback of part of the light to stimulate further emission of photons and lead to stimulated emission of the laser 110. The injected carrier concentration is increased in proportion to the current across the p-n junction 118, which is applied by an external circuit driving the laser 110. When the current applied to the laser 110 is above a threshold current, laser action occurs. Discontinuities in the energy bands at the junction 118 between the wide band-gap InP layers 122 and the narrow gap InGaAs layers 120 of the active region 116 in the heterostructure prevent injected electrons from crossing into the wide gap layers 122. Thus the injected carriers are confined to the middle active region 116 layer. The emitted light is confined and guided by the structure of the wide band-gap InP layers 122, which serve as a dielectric waveguide. The beam emerges in two directions from the active region 116.

The InP/InGaAs/InP multiple quantum well heterostructure laser 110 has limited optical and electrical confinement but a simplified material growth and fabrication process. The threshold current is estimated to range from 30 to 40 mA. The output wavelength is estimated to range from 1.3μ to 1.5μ.

Heterojunction bipolar transistor (HBT) 140 serves as a driver for the quantum well laser 110. A heterojunction bipolar transistor is a bipolar junction transistor 140 in which the emitter is formed from a semiconductor having a wide energy gap and the base is formed from a semiconductor material having a narrow energy gap. The HBT 140 has an emitter-down structure and includes an n-ion doped InGaAs collector 142 as a top layer, a heavily doped p⁺-ion InGaAs base 144 in the middle and a heavily doped n⁺-ion InP emitter 146 as a bottom layer. The n-type doped collector 142 is separated by a p-type doped base surface region 152 into a laser interface region 148 and a MSM interface region 150. The HBT 140 layers are configured with the emitter-down structure and the wide-gap materials are suitably doped so that the size of the combined laser interface region 148 and a MSM interface region 150 of the collector region 142 is smaller than the size of the emitter 146 regions. A bias diode 162, which is connected between the emitter layer 146 and the base layer 144 at a trough 166 of a bias diode trench 164, furnishes a contact between the emitter 146 and the base 144. In the illustrative embodiment, emitter 144 is a 300 nm thick n⁺-InP emitter which is heavily doped with n-type ions to a concentration of $5 \times 10^{17}$ cm⁻³. Base is a 150 nm thick $p^+$-$In_{0.53}Ga_{0.47}As$ base which is heavily doped with p-type ions to a concentration of $2 \times 10^{18}$ cm⁻³. Collector 142 is a 500 nm thick n-$In_{0.53}Ga_{0.47}As$ collector which is lightly doped with n-type ions to a concentration of $10^{17}$ cm⁻³. A collector metal layer 156, which is constructed from a suitable metal such as titanium or tungsten, is formed overlying a portion of the laser interface region 148 of the collector 142, near but isolated from the quantum laser 110. The connection between the collector metal layer 156 and the laser interface region 148 of the collector 142 is a Schottky junction which forms a collector load diode 160. The collector metal layer 156 is electrically connected to a collector terminal 158 which is connectable to an external signal source (not shown). The external signal is applied to the collector terminal 158, either to bias the output signal of the OEIC 100 or to drive a selected output signal pattern to the quantum laser 110.

The metal-semiconductor-metal (MSM) photodetector 170 is a photoconductive cell which includes a pair of metal Schottky contacts, including a first Schottky contact 172 and a second Schottky contact 174, and a semiconductor material furnished by the HBT 140. Each Schottky contact 172 and 174 has the form of a plurality of interdigitated fingers 176, which are formed as a thin film upon a semiconductor material. The top layer of the HBT 140, the n-doped $In_{0.53}Ga_{0.47}As$ collector 142, furnishes the semiconductor material of the planar MSM photodetector 170.

In this manner, the HBT/MSM interface includes a Schottky diode 178 which is formed by a metal/semiconductor junction between a first MSM 170 metal contact and the n-type semiconductor laser interface region 148 of the collector 142. The HBT/MSM interface also includes an ohmic contact 1SO between the first MSM 170 metal contact and the p-type HBT base region 144. Suitable metals for the MSM 170 include Tungsten/Titanium and Gold/Germanium/Nickel alloys, for example. A Tungsten/Titanium alloy furnishes a better Schottky junction. Gold/Germanium/Nickel supplies a better ohmic junction. A suitable spacing of the interdigitated metal fingers 176 of the MSM photodetector 170 is between approximately 1 and 2μ. The pair of metal Schottky contacts 172 and 174 are overlaid by an antireflection coating 182.

The thin profile (e.g. approximately 10 nm) metal film making up the Schottky contacts 172 and 174 in combination with the antireflection layer 182 avoid losses due to absorption and reflection. The first Schottky contact 172 is connected to a MSM bias terminal which is connectable to an external MSM bias signal line (not shown). The interdigitated form of the Schottky contacts 172 and 174 reduces parasitic resistances.

The MSM 170 operates in the following manner. Light impinging on the MSM 170 semiconductor material generates a photocurrent as electrons are produced in the conduction band and holes are produced in the valance band of the undoped region of the MSM 170. Light creates the photocurrent by one of two processes with the operative process determined by the magnitude of the incident photon energy hv relative to the energy gap $E_E$ of the semiconductor and the reduced work function $\phi_{Bn}$ of the metal. If $E_g$ is greater than hv and hv is greater than $\phi_{Bn}$, then photoelectric emission of electrons from metal to semiconductor occurs. Alternatively, if hv is greater than $E_g$, then photoconductive electron-hole pairs are produced in the semiconductor. The generated electrons and holes are separated by an electric field intrinsically formed in the semiconductor. Conductivity of the MSM 170 semiconductor increases in response to application of light or other radiation of a suitable wavelength and a photocurrent, which is superimposed on a small dark current, flows in a circuit which is external to the MSM 170 via connections to the HBT 140. A first connection of the MSM 170 to the HBT 140 is the first Schottky contact 172 to the n-type laser interface region 148 of the HBT collector 142. A second connection is an ohmic contact 180 to the p-type base surface region 152 of the HBT 140.

The MSM 170 has an overall dimension ranging from approximately 150 to 300μ. The MSM 170 speed, and therefore bandwidth, is determined by charge carrier transit time so that the size of the MSM 170 determines the operating bandwidth. The MSM detects optical wavelengths ranging from approximately 1.3 to 1.5, has a high gain and a response time of about 100 psec.

The quantum laser 110, HBT 140 and MSM 170 are interconnected so that first Schottky contact 172—a single metal pad—of the MSM photodetector 170 forms the ohmic contact 180 of the MSM photodetector 170 to the base 144 of the HBT 140, a Schottky diode contact 154 of the laser 110 to the collector 142 of the HBT 140 and a negative potential contact of the HBT 140 with the MSM photodetector 170. Advantages of this interface are an improved circuit performance and a relatively simple fabrication process. The Schottky diode 154 interface of laser 110 to HBT 140 driver is used to clamp the output of the laser 110 to the input of the driver. This achieves high speed circuit performance. Load impedances are furnished by the Schottky diode contact 154 of the laser 110 to the collector 142 of the HBT 140 and the Schottky diode junction between the base 144 and emitter 146 of the HBT 140. In this manner, the load impedances which improve performance of the circuit, are supplied by diode connections at the various metal-semiconductor interfaces in the OEIC 100. Because all load impedances are furnished by diode junctions, no resistors are implemented to furnish load impedances. If resistors were used to supply appropriate load impedances, resistor sizes would typically be so large that the size of the OEIC 100 would be substantially and detrimentally increased.

Figure 2:
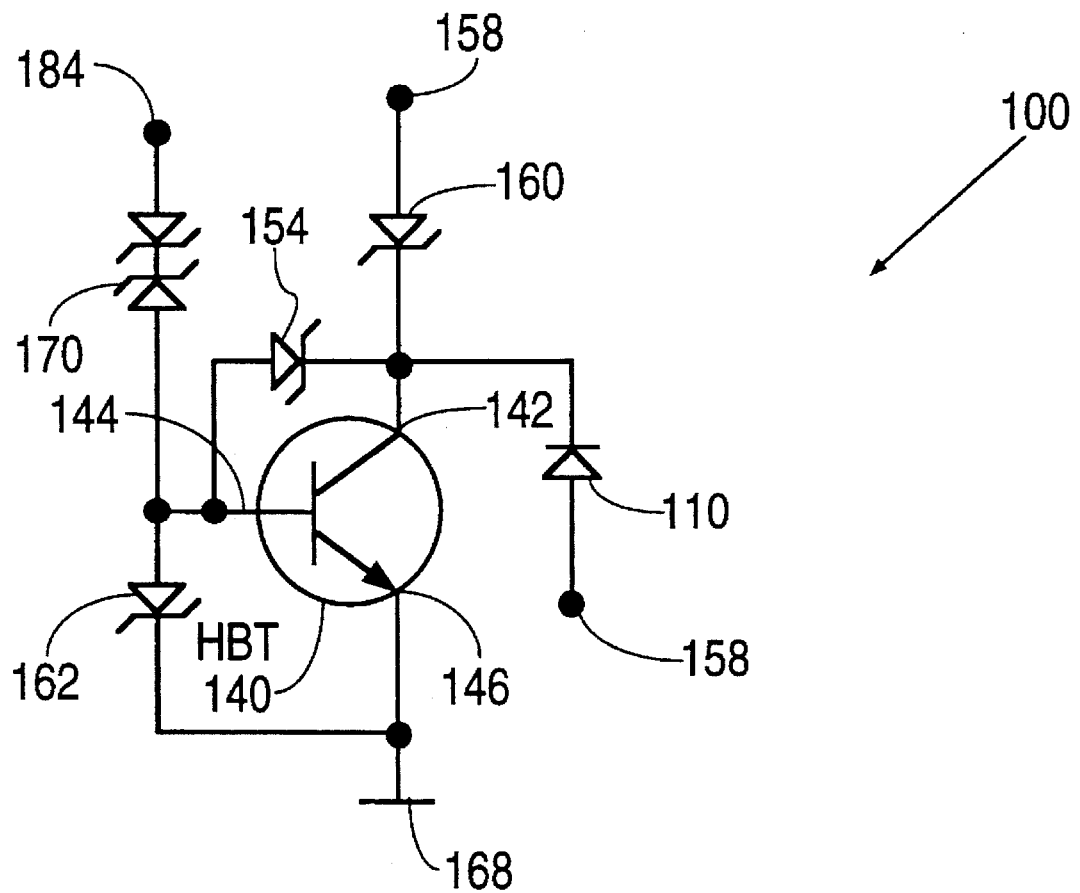
FIG. 2 is a circuit diagram for the optoelectronic integrated circuit shown in FIG. 1.

Referring to FIG. 2, a circuit diagram for the OEIC 100 shows the interconnections between the quantum laser 110, the HBT 140 and the MSM detector 170. The HBT 140 has an emitter-down structure having the emitter 146 connected to a reference terminal 168, the base 144 connected to the MSM photodetector 170 and the laser interface region 148 of the collector 142 connected to the quantum laser 110. An optical output signal of the quantum laser 110 is generated which varies as a function of an optical input signal and an electrical input signal. The optical input signal is sensed and converted to a voltage signal by the MSM photodetector 170 first Schottky contact 172 and second Schottky contact 174. This voltage signal is applied to the base 144 of the HBT 140. The MSM bias terminal 184 is connected to the first Schottky contact 172. A selected voltage is applied to the MSM bias contact to adjust the calibration of the MSM 170 so that a suitable regulated voltage is supplied to the base 144 of the HBT 140 in response to a particular amplitude and frequency of detected light.

The electrical input signal is connected from an external signal source (not shown) to the collector terminal 158 of the HBT 140 and is applied through the collector load diode 160 both to the collector 142 of the HBT 140 and to the quantum laser 110. In most applications, the external signal is generally controlled to generate a selected output signal pattern to the quantum laser 110. Alternatively, the external signal is applied to the collector terminal 158 to bias the output signal of the OEIC 100.

The quantum laser 110 has an OEIC 100 internal connection to the collector 142 of the HBT 140, which is also connected to the collector terminal 158 through the collector load diode 160. Thus, in one mode of operation, the external signal source controls the light signal from the quantum laser 110 using an essentially direct connection from the collector terminal 158 to the quantum laser 110. In a second operating mode, light signals detected by the MSM photodetector 170 are converted to electrical signals and driven to the quantum laser 110 by the HBT 140. In a third operating mode, optical signals sensed by the MSM photodetector 170 and electrical signals applied to the collector terminal 158 activate the quantum laser 110 in combination.

The output signal of the quantum laser 110 is regulated by a laser bias signal which is applied from an external source (not shown) to the laser bias terminal 132. The laser bias voltage regulates activation of the quantum laser 110.

The OEIC 100 circuit includes an interconnection of the base 144 to the collector 142 of the HBT 140 through a diode created by the Schottky diode 178 of the first MSM 170 metal contact with the n-type HBT collector region 142. In addition, the base 144 is connected to the emitter 146 of the HBT 140 through the bias diode 162 which serves as a load impedance and improves circuit performance.

Numerous advantages accrue from various characteristics of the OEIC 100. The usage of a heterojunction bipolar transistor is advantageous because the heterojunction effectively controls the distribution and flow of electrons and holes, independently of one another, by utilizing the variations in energy gap between the two sides of the junction. The beta-current gain factor β is advantageously controlled to have a high value by choosing the semiconductor materials of regions on different sides of the heterojunction to have greatly varying energy-gap differences nearly without regard for the doping level of the regions. Therefore, a heterojunction achieves a large β even though the base is heavily doped to realize a low base resistance.

Furthermore, an HBT achieves a high operating speed. The oscillation frequency of a bipolar transistor is increased in proportion to the square root of the base resistance so that, by reducing the base resistance by heavy doping, the operating frequency of the transistor is increased. Also, the reduction in base resistance by heavy doping reduces the power that is dissipated in the base region. Thus in an HBT, the base doping level is advantageously made as large as technically practicable and performance is not degraded.

The relative sizes of the collector, base and emitter are advantageous because having the emitter larger than the collector is beneficial to reduce the collector capacitance and accelerate the switching speed of the transistor. The base width is selected to be relatively short to reduce the transit time across the base and to improve speed of the device. Parasitic capacitances, resistances and power dissipation all vary as a function of emitter dimensionality.

The emitter-down structure is advantageous because it is beneficial for the emitter to be larger than the collector, thus the semiconductor is more easily fabricated by employing the emitter as a buried layer and by doping the smaller collector regions into the surface of the semiconductor wafer.

The selected semiconductor materials are advantageous because the lattice structure of the materials InP $In_{0.53}Ga_{0.47}As$ is matched, which is indicated by virtually identical lattice constants. Therefore, there are few structural dislocations at the interface between the materials. Electrons in the conduction band enter the base from the emitter with very large kinetic energies and therefore have a high effective velocity entering the base. Usage of InGaAs as the base material advantageously has a high electron mobility, 1.6 times higher than GaAs and 9 times higher than silicon for pure materials. The directional nature of the dominant polar optical scattering in the indium gallium arsenide of the base cause the electrons to traverse the base region maintaining this high velocity. A high effective velocity of the electrons in the base improves the maximum beta-current gain factor $\beta_{MAX}$ of the transistor. HBTs having an InP emitter are particularly advantageous because they have a high conduction band discontinuity that injects hot electrons with a high initial velocity into the base region so that electrons move at near ballistic speeds across the narrow base region, resulting in picosecond transit times. Heavy doping of the base region advantageously reduces the base resistance of the transistor. Relatively light doping of the emitter reduces the emitter-base capacitance. Both factors improve operation speed of the transistor. The band gap of InGaAs is smaller than that of GaAs or Si so that the turn-on $V_{BE}$ is smaller, the power-supply voltage requirement is lower and the power dissipation is lower.

Furthermore, the InP/InGaAs/InGaAs layers form a single heterojunction bipolar transistor and therefore do not have a barrier for electrons moving from the base into the collector. This advantageously results in a higher gain but at the expense of a large collector/emitter offset voltage which is detrimental to low power operation.

In addition, an emitter constructed from InP substrate is compatible with long wavelength laser technology. InGaAs is directly compatible with lasers and photodetectors that respectively generate and detect 1.3 micron radiation. This wavelength corresponds to the wavelength of lowest frequency dispersion in silica-based fibers and the wavelength of semiconductor lasers with the fastest modulation capability. Also, the InP substrate in the emitter region has a wider energy gap than the InGaAs substrate in the active base region, resulting in a high translucence of the semiconductor wafer which allows backside illumination and the use of emitter down structures. This characteristic has significance in the present laser/photodetector application.

Surface recombination, which is a problem in GaAs transistors, is comparatively improved for InP devices. The recombination velocity at surfaces of InGaAs is much smaller ($10^3$ cm/s) than that of GaAs surfaces ($10^6$ cm/s) so that there is less base current caused by emitter periphery recombination. This facilitates scaling to smaller devices.

Further advantages accrue from the selection of an MSM as the photodetector. An MSM is the easiest type of photodetector to integrate into the laser/HBT structure and has the highest speed as compared to other detectors.

Figure 3:
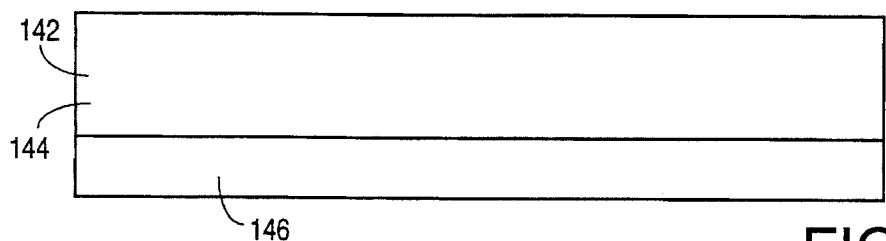
FIGS. 3 through 8 illustrate process cross sectional representations of a portion of a semiconductor wafer at successive steps in a process for fabricating an optoelectronic integrated circuit.

Referring to FIG. 3, the HBT 140, quantum laser 110 and MSM photodetector 170 of the OEIC 100 are formed using a metal-organic chemical vapor deposition (MOCVD) technique in which very uniform thin films are deposited by the gas-phase reduction of highly reactive chemicals under low pressure in a deposition chamber. A flow of molecules containing the semiconductor and doping species is passed over a heated GaAs substrate crystal. The molecules striking the heated crystal release the desired species, yielding a deposition of crystal growth.

The indium phosphide (InP) emitter 146 is grown by depositing a 300 nm n$^+$-InP emitter layer via the MOCVD process. The InP emitter layer is doped n$^+$ to a concentration of $5 \times 10^{17}$ cm$^{-3}$. The indium gallium arsenate base 144 and collector 142 are then grown to a depth of approximately 650 nm. This depth includes both the thickness of the collector 142 and base 144. The InGaAs combined base 144 and collector 142 layer is grown using the MOCVD process and applying metal-organic trimethylgallium (TMG) or triethylgallium (TEG) gases to deposit gallium and arsine (ASH3) gas to deposit arsenic. The InGaAs collector 142 and base 144 layer is doped p$^+$ to a concentration of to a concentration of $2 \times 10^{18}$ cm$^{-3}$.

Figure 4:
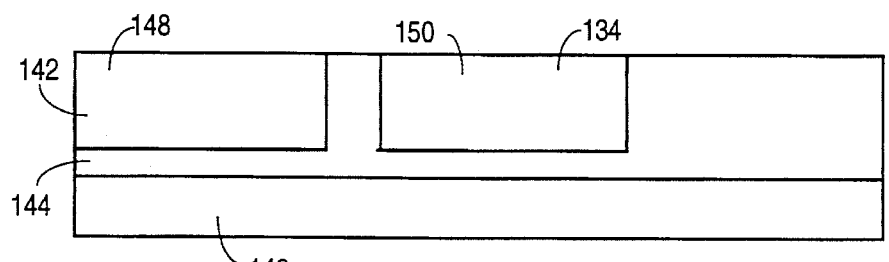

A photoresist mask is formed on the surface of the combined base 144 and collector 142 layer. The photoresist mask is patterned to protect a region of the surface at which the bias diode 162 is etched and also is patterned to protect the base surface region 152, a strip of base 144 region between the laser interface region 148 and the MSM interface region 150 of the collector 142. As is shown in FIG. 4, N-type ions are implanted into the patterned surface of the combined base 144 and collector 142 region to dope the two surface collector regions 142 to a depth of approximately 500 nm and a concentration of approximately $10^{17}$ cm$^{-3}$.

Figure 5:
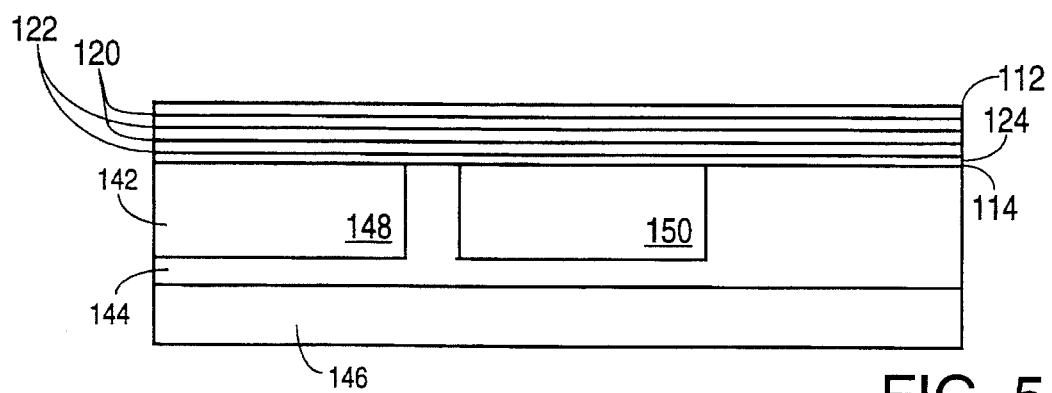

Referring to FIG. 5, a 7μ SiO$_2$ insulated Al/Au strip is deposited over the collector 142 surface by chemical vapor deposition to form a contact between the HBT collector 142 and the lower cladding layer. On the surface of the SiO$_2$ layer, the n-type lower cladding InP layer of the quantum well laser 110 is grown to a depth of approximately 15 nm in the manner of the emitter growth and heavily silicon-doped with n-type ions. The quantum well active region 116 of the laser 110 is then formed by depositing very thin (e.g. approximately 7 nm) InGaAs layers 120 between thin (e.g. about 15 nm) InP barrier layers. These layers are formed in the manner of the combined collector 142 and base 144 layer and the emitter 146 layer, respectively. On the surface of the quantum well structure, the p-type upper cladding InP layer 112 of the quantum well laser 110 is grown to a depth of approximately 15 nm in the manner of the emitter 146 growth and heavily doped with p-type zinc ions.

The doped layers are grown by flowing the gases in selected concentrations with a molecular hydrogen (H$_2$) carrier over an inductively or radiatively heated GaAs substrate. The chamber is not heated and the CVD takes place at atmospheric pressure. Alternatively, a low pressure (e.g. approximately 76 torr) CVD may be applied.

Figure 6:
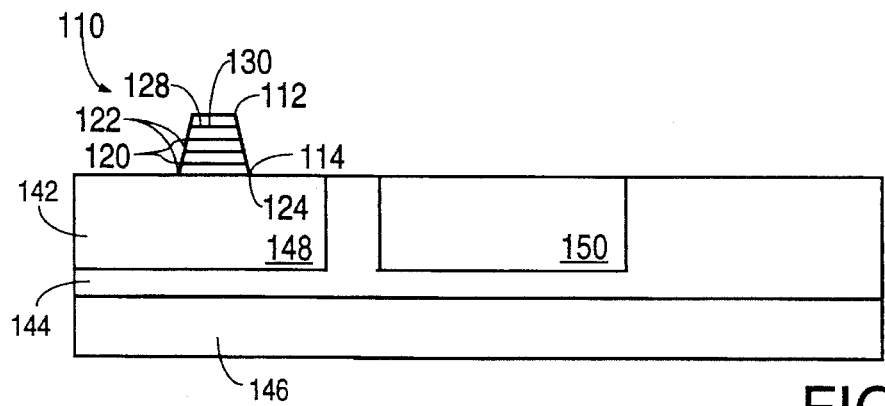

Referring to FIG. 6, a thin strip trench 128 is etched into the upper cladding InP layer 112 for deposition of a metal contact. The laser 110 quantum well structure is etched to form the laser mesa structure 126 for isolation. The laser region is protected and the surface is otherwise etched to the depth of the collector 142 layer. The etching process is aided by composition-selective etchants which have an etch rate which is selected to slow at a layer having a particular composition.

Figure 7:
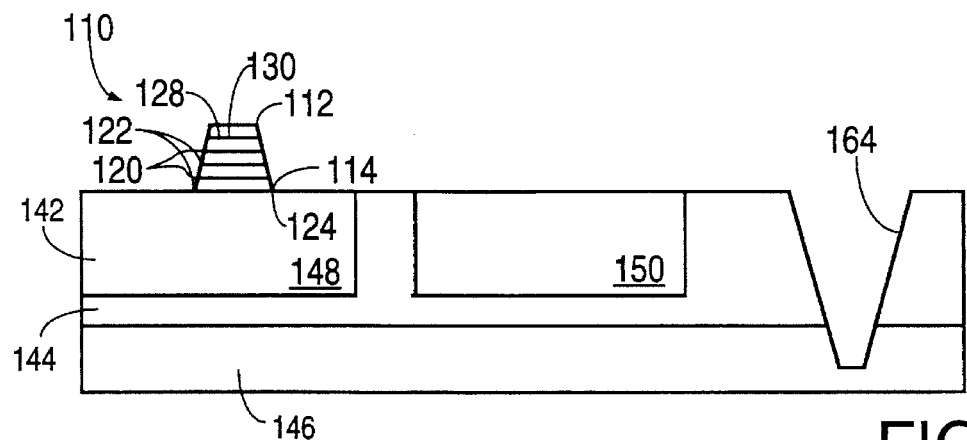

The HBT 140 surface of the collector layer 142 is protected, leaving the region of the bias diode 162 unprotected and the bias diode trench 164 is etched in the manner shown in FIG. 7. The bias diode trench 164 is etched using an orientation-selective etchant which etches the trench 164 sidewalls so that the crystallographic orientation of the base InGaAs layer 144 is etched at a suitable angle (for example, 55 degrees) with respect to the surface. A metal layer, which is constructed from a suitable metal such as titanium or tungsten, is formed in the trough of the bias diode trench 164 to form the bias diode 162.

Figure 8:
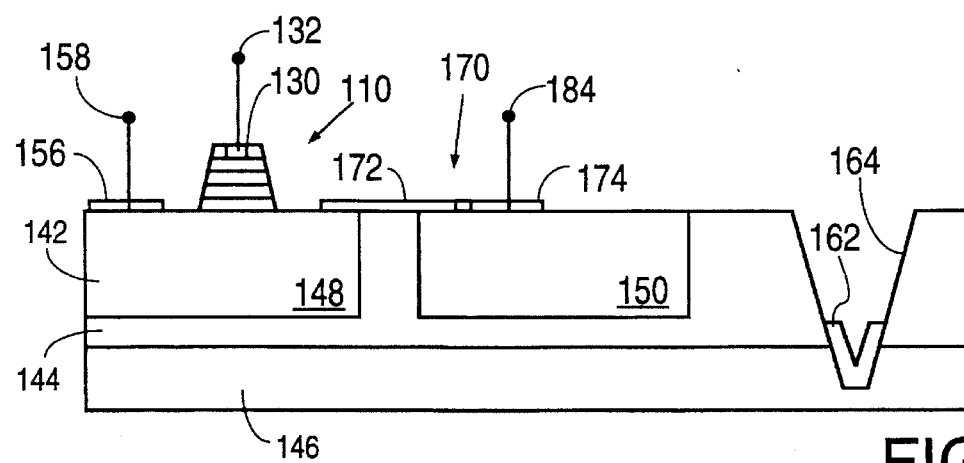

Referring to FIG. 8, a metal layer is deposited on the collector 142 layer to form the collector 142 bias contact. A metal strip layer is deposited in the thin strip trench 128 etched into the upper cladding InP layer 112 to form the laser 110 bias contact.

A metal layer of the MSM 170 which is constructed of either Tungsten/Titanium or Gold/Germanium/Nickel alloys is formed on the collector 142 surface of the HBT 140 extending partially over both collector 142 regions. The metal layer is etched to the depth of the collector 142 layer, severing the metal layer into the pair of metal Schottky contacts 172 and 174 using photolithographic methods to form the interdigitated fingers. One Schottky contact 172 extends from the collector 142 region underlying the quantum laser 110 across the surface base region partially over the second collector 142 region. The second Schottky contact 174 covers only a part of the second collector 142 region and is connected to the MSM bias terminal 184.

The fabrication method is simple because it includes only common deposition, etching and metal forming steps. Furthermore, the transistor, laser and photodetector devices share the same semiconductor layers and to not require formation of isolating barriers. These characteristics of the fabrication process advantageously result in a high yield.

It will be appreciated that particular aspects of the optoelectronic integrated circuit are particularly specified including the semiconductor materials employed, the type of bipolar circuit, and the form of the laser and photodetector. The substrate, the laser and the MSM photodetector may have different shapes and forms and may be constructed from different materials. For example, the interdigitated Schottky contacts may be fabricated in a circular form for improved detection of circular light beams. Other materials, circuit types and component forms may be used. Furthermore, other semiconductor materials may be employed such as aluminum gallium arsenide (AlGaAs). Also a complementary PNP bipolar transistor may be used for the HBT. Other known forms of lasers and photodetectors may be employed.

With respect to the process for fabricating the OEIC, process parameters such as chemical reactants, pressures, and temperatures are provided but other parameters may also be used. Accordingly, various other embodiments and modifications and improvements not described herein may be within the spirit and scope of the present invention, as defined by the following claims.

We claim:

1. A monolithic optoelectronic integrated circuit comprising:

an emitter-down heterostructure bipolar transistor having a planar surface and having a buried emitter layer, a surface collector layer separated into a plurality of surface regions and a medial base layer coupled between the emitter layer and the collector layer and having a region extending between collector layer surface regions to the planar surface;

a laser overlying and coupled to a first collector surface region of the plurality of collector surface regions; and a metal layer of a metal-semiconductor-metal photodetector overlying and coupled to a portion of the planar surface including part of the first collector surface region, the base layer surface region and a second collector surface region.

2. A circuit as in claim 1 further comprising:

a bias diode coupling the base layer and the emitter layer of the heterostructure bipolar transistor.

3. A circuit as in claim 1 wherein the heterostructure bipolar transistor furnishes the semiconductor layer of the metal-semiconductor-metal photodetector.

4. A circuit as in claim 1 wherein the heterostructure bipolar transistor includes:

an n-type lightly-doped InGaAs collector in the surface layer;

a p-type heavily-doped InGaAs base medial layer; and an n-type heavily-doped InP emitter in the buried layer.

5. A circuit as in claim 1 wherein the heterostructure bipolar transistor includes:

an $In_{0.53}Ga_{0.47}As$ collector lightly-doped with n-type ions to a concentration in the range from approximately $10^{16}$ cm$^{-3}$ to approximately $10^{18}$ cm$^{-3}$ and having a thickness in the range from approximately 300 nm to approximately 700 nm;

an $In_{0.53}Ga_{0.47}As$ base heavily-doped with p-type ions to a concentration in the range from approximately $10^{17}$ cm$^{-3}$ to approximately $10^{19}$ cm$^{-3}$ and having a thickness in the range from approximately 100 nm to approximately 200 nm; and an InP emitter heavily-doped with n-type ions to a concentration in the range from approximately $10^{17}$ cm$^{-3}$ to approximately $10^{18}$ cm$^{-3}$ and having a thickness in the range from approximately 200 nm to approximately 400 nm.

6. A circuit as in claim 1 wherein the heterostructure bipolar transistor includes:

an $In_{0.53}Ga_{0.47}As$ collector lightly-doped with n-type ions to a concentration of approximately $10^{17}$ cm$^{-3}$ and having a thickness of approximately 500 nm;

an $In_{0.53}Ga_{0.47}As$ base heavily-doped with p-type ions to a concentration of approximately $2\times10^{18}$ cm$^{-3}$ and having a thickness of approximately 150 nm; and an InP emitter heavily-doped with n-type ions to a concentration of approximately $5\times10^{17}$ cm$^{-3}$ and having a thickness of approximately 300 nm.

7. A circuit as in claim 1 wherein the laser is a cleaved-cavity multiple quantum well InP/InGaAs structure including:

an upper cladding layer;

a lower cladding layer;

a contact layer coupling the lower cladding layer to the heterostructure bipolar transistor collector; and an active region coupled between the upper and lower cladding layers and having a plurality of alternating InGaAs and InP layers.

8. A circuit as in claim 7 wherein:

the upper cladding layer is a heavily-zinc-doped p-type InP layer having a thickness in the range from 1µ to 10µ;

the lower cladding is a heavily-silicon-doped n-type InP layer having a thickness in the range from 0.5µ to 15µ;

the contact layer is a $SiO_2$ insulated Al/Au strip having a thickness in the range from 3µ to 20µ; and the laser active region includes a plurality of eight to sixteen $In_{0.53}Ga_{0.47}As$ layers having a thickness in a range from 3 nm to 20 nm alternating with InP barrier layers having a thickness in the range from 7 nm to 25 nm.

9. A circuit as in claim 7 wherein:

the upper cladding layer is a heavily-zinc-doped p-type InP layer having a thickness of approximately 1.5µ;

the lower cladding is a heavily-silicon-doped n-type InP layer having a thickness of approximately 2.5µ;

the contact layer is a $SiO_2$ insulated Al/Au strip having a thickness of approximately 7µ; and the laser active region includes a plurality of eight to sixteen $In_{0.53}Ga_{0.47}As$ layers having a thickness of approximately 7 nm alternating with InP barrier layers having a thickness of approximately 15 nm.

10. A circuit as in claim 1 wherein the metal-semiconductor-metal photodetector is an interdigitated metal pad having a plurality of detector fingers and fabricated overlying and adjacent to the collector of the heterostructure bipolar transistor.

11. A circuit as in claim 10 wherein interdigitated metal layer of the metal-semiconductor-metal photodetector is constructed from a Tungsten/Titanium alloy.

12. A circuit as in claim 10 wherein interdigitated metal layer of the metal-semiconductor-metal photodetector is constructed from a Gold/Germanium/Nickel alloy.

13. A circuit as in claim 10 wherein interdigitated metal fingers have a circular form.

14. A circuit as in claim 10 wherein:

the metal pad has a thickness in the range from 150μ to 300μ; and the size of the spacing between the detector fingers is in the range from 1μ to 2μ.

15. A circuit as in claim 1 further comprising:

a collector bias terminal coupled to receive a collector bias signal; and a collector load diode coupled from the collector bias terminal to the collector of the heterostructure bipolar transistor.

16. A circuit as in claim 15 wherein the collector load diode includes a metal pad overlying and adjacent to the collector of the heterostructure bipolar transistor.

17. A circuit as in claim 1 further comprising a metal-semiconductor-metal bias terminal coupled to the metal pad of the metal-semiconductor-metal photodetector to receive a metal-semiconductor-metal bias signal.

18. A circuit as in claim 1 further comprising a laser bias terminal coupled to the upper cladding layer of the quantum well laser to receive a laser bias signal.

19. A monolithic optoelectronic integrated circuit comprising:

a heterostructure bipolar transistor having a base, an emitter and a collector;

a quantum well laser coupled to the collector of the heterostructure bipolar transistor; and a metal-semiconductor-metal photodetector coupled by an ohmic contact to the base of the heterostructure bipolar transistor and coupled by a Schottky contact to the collector of the heterostructure bipolar transistor.

20. A circuit as in claim 19 further comprising:

a bias diode coupling the base and the emitter of the heterostructure bipolar transistor.

21. A circuit as in claim 19 wherein the heterostructure bipolar transistor has a three-layer emitter-down structure and includes:

an n-type lightly-doped InGaAs collector in the top layer;

a p-type heavily-doped InGaAs base in the middle layer; and an n-type heavily-doped InP emitter in the bottom layer.

22. A circuit as in claim 19 wherein the heterostructure bipolar transistor includes:

an $In_{0.53}Ga_{0.47}As$ collector lightly-doped with n-type ions to a concentration in the range from approximately $10^{16}$ $Cm^{-3}$ to approximately $10^{18}$ $cm^{-3}$ and having a thickness in the range from approximately 300 nm to approximately 700 nm;

an $In_{0.53}Ga_{0.47}As$ base heavily-doped with p-type ions to a concentration in the range from approximately $10^{17}$ $cm^{-3}$ to approximately $10^{10}$ $cm^{-3}$ and having a thickness in the range from approximately 100 nm to approximately 200 nm; and an InP emitter heavily-doped with n-type ions to a concentration in the range from approximately $10^{17}$ $cm^{-3}$ to approximately $10^{18}$ $cm^{-3}$ and having a thickness in the range from approximately 200 nm to approximately 400 nm.

23. A circuit as in claim 19 wherein the heterostructure bipolar transistor includes:

an $In_{0.53}Ga_{0.47}As$ collector lightly-doped with n-type ions to a concentration of approximately $10^{17}$ $cm^{-3}$ and having a thickness of approximately 500 nm;

an $In_{0.53}Ga_{0.47}As$ base heavily-doped with p-type ions to a concentration of approximately $2\times10^{18}$ $cm^{-3}$ and having a thickness of approximately 150 nm; and an InP emitter heavily-doped with n-type ions to a concentration of approximately $5\times10^{17}$ $cm^{-3}$ and having a thickness of approximately 300 nm.

24. A circuit as in claim 19 wherein the quantum well laser is a cleaved-cavity multiple quantum well InP/InGaAs structure including:

an upper cladding layer;

a lower cladding layer;

a contact layer coupling the lower cladding layer to the heterostructure bipolar transistor collector; and an active region coupled between the upper and lower cladding layers and having a plurality of alternating InGaAs and InP layers.

25. A circuit as in claim 24 wherein:

the upper cladding layer is a heavily-zinc-doped p-type InP layer having a thickness in the range from 1μ to 10μ;

the lower cladding is a heavily-silicon-doped n-type InP layer having a thickness in the range from 0.5μ to 15μ;

the contact layer is a $SiO_2$ insulated Al/Au strip having a thickness in the range from 3μ to 20μ; and the laser active region includes a plurality of eight to sixteen $In_{0.53}Ga_{0.47}As$ layers having a thickness in a range from 3 nm to 20 nm alternating with InP barrier layers having a thickness in the range from 7 nm to 25 nm.

26. A circuit as in claim 24 wherein:

the upper cladding layer is a heavily-zinc-doped p-type InP layer having a thickness of approximately 1.5μ;

the lower cladding is a heavily-silicon-doped n-type InP layer having a thickness of approximately 2.5μ;

the contact layer is a $SiO_2$ insulated Al/Au strip having a thickness of approximately 7μ; and the laser active region includes a plurality of eight to sixteen $In_{0.53}Ga_{0.47}As$ layers having a thickness of approximately 7 nm alternating with InP barrier layers having a thickness of approximately 15 nm.

27. A circuit as in claim 19 wherein the metal-semiconductor-metal photodetector is an interdigitated metal pad having a plurality of detector fingers and fabricated overlying and adjacent to the collector of the heterostructure bipolar transistor.

28. A circuit as in claim 27 wherein interdigitated metal layer of the metal-semiconductor-metal photodetector is constructed from a Tungsten/Titanium alloy.

29. A circuit as in claim 27 wherein interdigitated metal layer of the metal-semiconductor-metal photodetector is constructed from a Gold/Germanium/Nickel alloy.

30. A circuit as in claim 27 wherein interdigitated metal fingers have a circular form.

31. A circuit as in claim 27 wherein:

the metal pad has a thickness in the range from $150\mu$ to $300\mu$; and the size of the spacing between the detector fingers is in the range from $1\mu$ to $2\mu$.

32. A circuit as in claim 19 further comprising:

a collector bias terminal coupled to receive a collector bias signal; and a collector load diode coupled from the collector bias terminal to the collector of the heterostructure bipolar transistor.

33. A circuit as in claim 32 wherein the collector load diode includes a metal pad overlying and adjacent to the collector of the heterostructure bipolar transistor.

34. A circuit as in claim 19 further comprising a metal-semiconductor-metal bias terminal coupled to the metal pad of the metal-semiconductor-metal photodetector to receive a metal-semiconductor-metal bias signal.

35. A circuit as in claim 19 further comprising a laser bias terminal coupled to the upper cladding layer of the quantum well laser to receive a laser bias signal.

36. A monolithic optoelectronic integrated circuit comprising:

an emitter-down heterostructure bipolar transistor having a planar surface and having a buried emitter layer, a surface collector layer separated into a plurality of surface regions and a medial base layer coupled between the emitter layer and the collector layer and having a region extending between collector layer surface regions to the planar surface; and a metal layer of a metal-semiconductor-metal photodetector, a semiconductor region of the photodetector being supplied by the semiconductor layers of the heterostructure bipolar transistor, the metal layer overlying and coupled to a portion of the planar surface including part of the first collector surface region, the base layer surface region and a second collector surface region.

37. A circuit as in claim 36 further comprising:

a bias diode coupling the base layer and the emitter layer of the heterostructure bipolar transistor.

38. A circuit as in claim 36 wherein the heterostructure bipolar transistor includes:

an n-type lightly-doped InGaAs collector in the surface layer;

a p-type heavily-doped InGaAs base medial layer; and an n-type heavily-doped InP emitter in the buried layer.

39. A circuit as in claim 36 wherein the heterostructure bipolar transistor includes:

an $In_{0.53}Ga_{0.47}As$ collector lightly-doped with n-type ions to a concentration in the range from approximately $10^{16}$ $cm^{-3}$ to approximately $10^{18}$ $cm^{-3}$ and having a thickness in the range from approximately 300 nm to approximately 700 nm;

an $In_{0.53}Ga_{0.47}$ base heavily-doped with p-type ions to a concentration in the range from approximately $10^{17}$ $cm^{-3}$ to approximately $10^{19}$ $cm^{-3}$ and having a thickness in the range from approximately 100 nm to approximately 200 nm; and an InP emitter heavily-doped with n-type ions to a concentration in the range from approximately $10^{17}$ $cm^{-3}$ to approximately $10^{18}$ $cm^{-3}$ and having a thickness in the range from approximately 200 nm to approximately 400 nm.

40. A circuit as in claim 36 wherein the heterostructure bipolar transistor includes:

an $In_{0.53}Ga_{0.47}As$ collector lightly-doped with n-type ions to a concentration of approximately $10^{17}$ $cm^{-3}$ and having a thickness of approximately 500 nm;

an $In_{0.53}Ga_{0.47}As$ base heavily-doped with p-type ions to a concentration of approximately $2\times10^{18}$ $cm^{-3}$ and having a thickness of approximately 150 nm; and an InP emitter heavily-doped with n-type ions to a concentration of approximately $5\times10^{17}$ $cm^{-3}$ and having a thickness of approximately 300 nm.

41. A circuit as in claim 36 wherein the metal-semiconductor-metal photodetector is an interdigitated metal pad having a plurality of detector fingers and fabricated overlying and adjacent to the collector of the heterostructure bipolar transistor.

42. A circuit as in claim 41 wherein interdigitated metal layer of the metal-semiconductor-metal photodetector is constructed from a Tungsten/Titanium alloy.

43. A circuit as in claim 41 wherein interdigitated metal layer of the metal-semiconductor-metal photodetector is constructed from a Gold/Germanium/Nickel alloy.

44. A circuit as in claim 41 wherein interdigitated metal fingers have a circular form.

45. A circuit as in claim 44 wherein:

the metal pad has a thickness in the range from $150\mu$ to $300\mu$; and the size of the spacing between the detector fingers is in the range from $1\mu$ to $2\mu$.

46. A circuit as in claim 36 further comprising:

a collector bias terminal coupled to receive a collector bias signal; and a collector load diode coupled from the collector bias terminal to the collector of the heterostructure bipolar transistor.

47. A circuit as in claim 46 wherein the collector load diode includes a metal pad overlying and adjacent to the collector of the heterostructure bipolar transistor.

48. A circuit as in claim 36 further comprising a metal-semiconductor-metal bias terminal coupled to the metal pad of the metal-semiconductor-metal photodetector to receive a metal-semiconductor-metal bias signal.

49. A circuit as in claim 36 further comprising a laser bias terminal coupled to the upper cladding layer of the quantum well laser to receive a laser bias signal.

* * * * *